United States Patent [19]

Yamada et al.

[11] Patent Number: 5,110,437
[45] Date of Patent: May 5, 1992

[54] PLASMA PROCESSING APPARATUS

[75] Inventors: Yuichiro Yamada; Yosinari Matusita; Yuji Tutui, all of Osaka, Japan

[73] Assignee: Matsushita Electric Industrial Co., Ltd., Osaka, Japan

[21] Appl. No.: 634,732

[22] Filed: Dec. 27, 1990

[30] Foreign Application Priority Data

Dec. 29, 1989 [JP] Japan .................. 1-341532

[51] Int. Cl.$^5$ .................. H05H 1/46; B01J 19/12
[52] U.S. Cl. .................. 204/298.33; 156/345; 118/723; 204/298.34
[58] Field of Search .................. 204/298.07, 298.33, 204/298.34; 156/345, 643; 118/723

[56] References Cited

U.S. PATENT DOCUMENTS 4,908,095  3/1990  Kagatsume et al. .................. 156/643

FOREIGN PATENT DOCUMENTS

| 57-42131 | 3/1982 | Japan | 156/345 |
| 57-102022 | 6/1982 | Japan | 204/298.33 |
| 60-184679 | 9/1985 | Japan | 118/723 |
| 2-213468 | 8/1990 | Japan | 204/298.07 |

Primary Examiner—Aaron Weisstuch
Attorney, Agent, or Firm—Wenderoth, Lind & Ponack

[57] ABSTRACT

A plasma processing apparatus includes a chamber, a pair of spaced apart electrodes positioned within the chamber, a gas evacuation pipe for evacuating the chamber and a gas feed pipe for introducing gas into the chamber. At least one of the electrodes and the gas evacuation and feed pipes can be selectively moved by lifting devices in opposite directions along which the electrodes oppose each other. Further, a polarity of the voltage applied to the electrodes is reversible.

5 Claims, 2 Drawing Sheets

PLASMA PROCESSING APPARATUS

BACKGROUND OF THE INVENTION

1. Field of the Invention

The present invention relates to a plasma processing apparatus which can be used to effect processes such as to plasma chemical vapor deposition and plasma dry etching.

2. Description of the Related Art

In a previous plasma processing apparatus, a lower plate electrode and an upper plate electrode are spaced apart within a chamber, and a workpiece is placed on the lower electrode. For example, the upper electrode is connected to a high frequency electric power source while the lower electrode is connected to ground. Reaction gas is introduced into the chamber via a gas feed pipe, while the chamber is evacuated via an evacuation pipe. The upper plate electrode can be raised or lowered by a lifting device. The upper plate electrode is moved to control the distance between the lower plate electrode and the upper plate electrode according to optimum plasma processing conditions. However, during plasma processing the processing conditions may vary. For example, when a multi-layer film is formed on the surface of a workpiece, processing conditions are changed for each layer. As another example, after a workpiece is first treated at a high etching rate, the workpiece can be dry-etched at a low etching rate to secure the homogeneity of the surface. In such cases, the gas flow and plasma discharge cannot be optimized in each processing step because only the upper plate electrode can be moved.

Further, an ion assist effect is exerted only in the direction of one of the plate electrodes upon cleaning the inside of the chamber, so that cleaning of the entire inside of the chamber cannot be rapidly performed.

SUMMARY OF THE INVENTION

It is an object of the present invention to provide a plasma processing apparatus wherein the gas flow and plasma discharge can be optimized for each of plural processing steps having different processing conditions.

It is another object of the present invention to provide a plasma processing apparatus having an increased cleaning speed.

A plasma processing apparatus according to the present invention includes: (a) a chamber; (b) evacuation means for evacuating said chamber, the evacuation means including a gas evacuation pipe located in the chamber; (c) a pair of spaced apart electrodes positioned opposed to each other in said chamber; (d) first lifting means for moving one of the pair of electrodes in a direction toward and away from the other of the pair of electrodes; (e) a high frequency electric power source connected to the pair of electrodes so as to supply a high frequency electric voltage between the pair of electrodes; (f) gas introduction means for introducing gas into the chamber, the gas introduction means including a gas feed pipe located in the chamber; and (g) second lifting means for moving the gas feed pipe of the gas introduction means in a direction along which the pair of electrodes are opposed to each other.

It is an advantage of a plasma processing apparatus according to the present invention that the gas flow and plasma discharge can be optimized.

BRIEF DESCRIPTION OF THE DRAWINGS

Further objects and advantages of the present invention will be apparent from the following description with reference being made to the accompanying drawings, wherein preferred embodiments of the present invention are clearly shown.

DETAILED DESCRIPTION OF THE INVENTION

Figure 1:
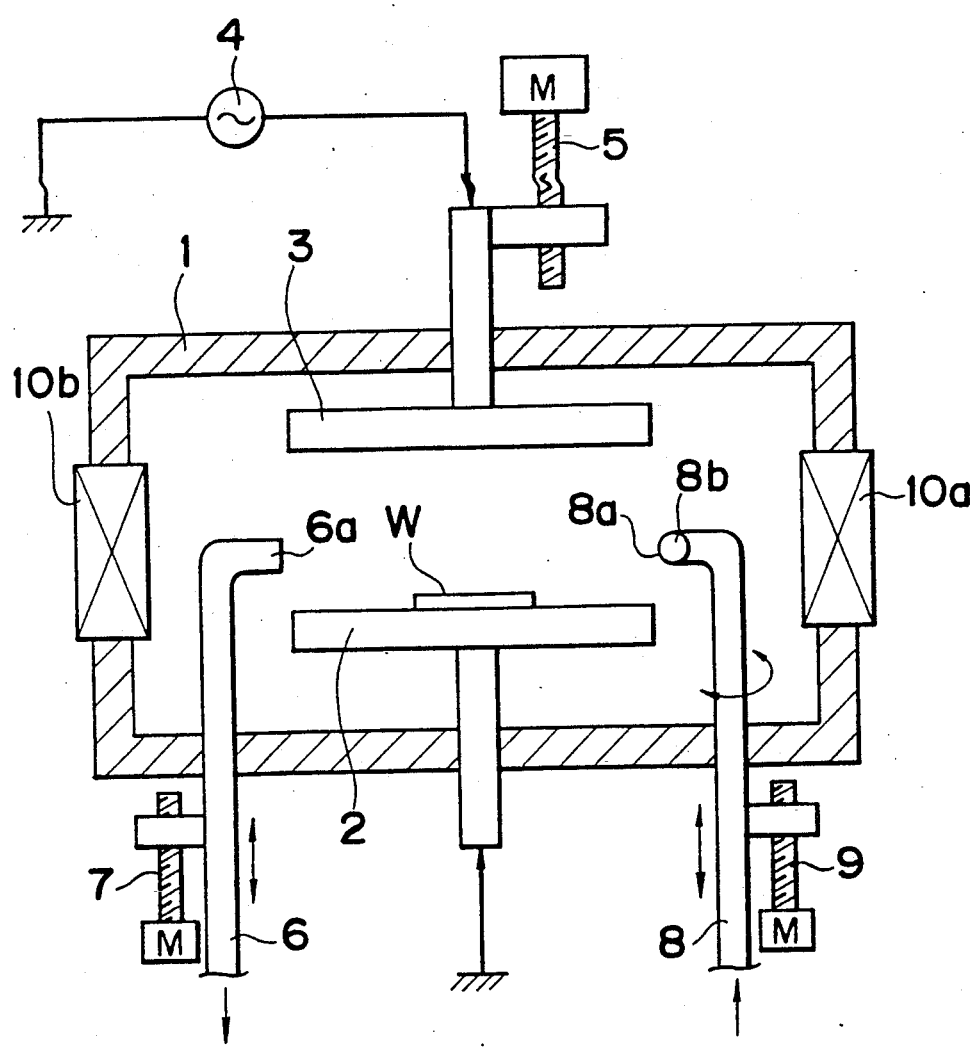
FIG. 1 is a schematic sectional view of a first embodiment of a plasma processing apparatus according to the invention.

Referring now to the drawings, wherein like reference characters designate like or corresponding parts throughout, embodiments of the present invention will be explained in detail.

Figure 2:
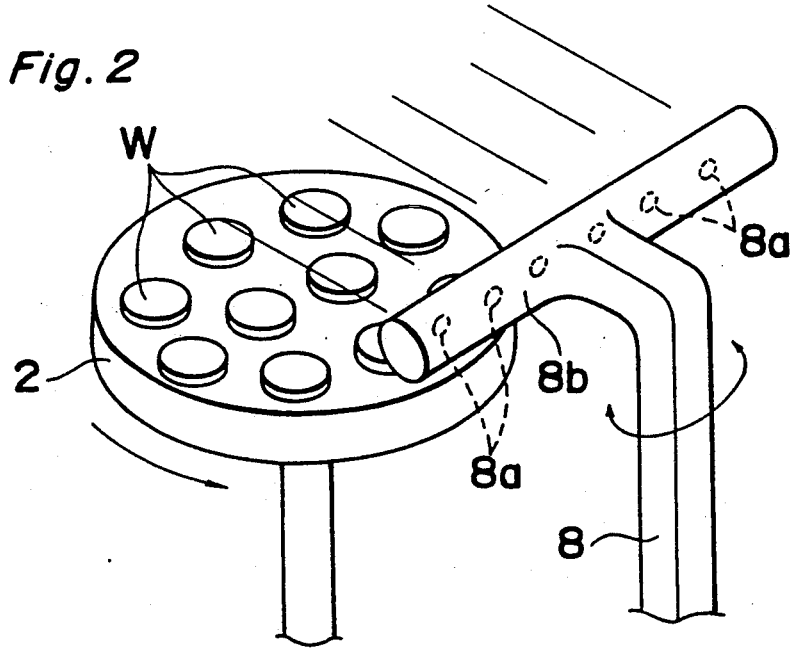
FIG. 2 is a perspective view of a lower electrode and a gas pipe.

FIG. 1 shows a schematic sectional view of a first embodiment of a plasma processing apparatus of the invention. Reference numeral 1 denotes a closable chamber having a lower electrode 2 (which supports one or more of workpieces W) positioned at a lower region therein, the lower electrode 2 being connected to electrical ground. As shown in FIG. 2, the lower electrode 2 is rotatable (in the direction shown by an arrow) so as to treat each workpiece uniformly, particularly when a plurality of workspieces W are supported on the lower electrode 2. An upper electrode 3, connected to a high frequency electric power source 4, is positioned confronting the upper surface of the lower electrode 2 and can be raised or lowered by a first lifting device 5 equipped with a motor M.

Reference numeral 6 denotes a gas evacuation pipe which is connected to a booster pump (not shown) and a rotary pump (not shown) via a vacuum valve (not shown) and a pressure control valve (not shown) in order to evacuate the chamber 1. The evacuation pipe 6 is raised or lowered by a second lifting device 7 equipped with a motor M in order to control the position of the inlet 6a. Reference numeral 8 denotes a gas pipe for introducing a reaction gas such as $SiH_4$ gas or $NH_3$ gas or an etchant gas such as a fluoride gas into the chamber 1. As shown in FIG. 2, a plurality of outlet apertures 8a are formed in a horizontal distribution pipe 8b at the top of the gas feed pipe 8. Further, the gas pipe 8 can be raised or lowered by a third lifting device 9 equipped with a motor M in order to control the positions of the outlet apertures 8a and can be rotated in both directions around the axis thereof, as shown by the double-head arrow in FIG. 2, by a rotation device (not shown) so as to supply gas homogeneously between the electrodes 2 and 3. The evacuation pipe 6 and the gas feed pipe 8 are made of an insulator such as ceramic to prevent anomalous discharge. When a controller (not shown) sets respective process conditions, the positions of respective lifting devices 5, 7, 9 are automatically controlled to achieve positions which are optimal for the gas flow and plasma discharge under such process conditions. The controller stores beforehand the optimum positions of the electrode 2, 3, the gas evacuation pipe 6 and the gas feed pipe 8 according to respective processing conditions. Reference numerals 10a and 10b in FIG. 1 denote gates for introducing and removing a workpiece.

Next, the operation of the plasma processing apparatus will be explained. The chamber 1 is evacuated via the evacuation pipe 6 to achieve a predetermined vacuum while a workpiece is placed on the lower electrode 2. Next, when the workpiece is plasma processed in plural processing steps, according to the process conditions of a first processing step, the position of the upper electrode 3 is controlled using the lifting device 5 so that the distance between the lower and upper electrodes 2, 3 becomes a predetermined value, the position of the gas feed pipe 8 is controlled using the lifting device 9 so that the outlet apertures 8a are located at positions most appropriate for the gas flow between the electrodes 2, 3, and the position of the gas evacuation pipe 6 is controlled using the lifting device 7 so that the inlet 6a is located at a position most appropriate for the gas flow. Then, a high frequency electric voltage is applied to the upper electrode 3 by the high frequency electric power source 4, and a predetermined amount of reaction gas or etching gas is introduced via the gas feed pipe 8 in the chamber 1. Thus, plasma is generated between the electrodes 2 and 3, and a deposition film is formed from the components of the reaction gas on the surface of the workpiece due to plasma gas phase growth, or dry etching is performed by the etchant gas.

Next, according to the processing conditions of the next processing step, the distance between the electrodes 2 and 3, and the positions of the evacuation pipe 6 and the gas feed pipe 8, are controlled for optimizing the gas flow between the electrodes 2 and 3, and the type of gas to be introduced is changed. Thus, the formation of a deposition film or dry etching is performed.

As explained above, the gas flow is optimized for each processing condition. Thus, the homogeneity of the plasma reaction can be increased, and high quality formations can be effectively achieved.

Figure 3:
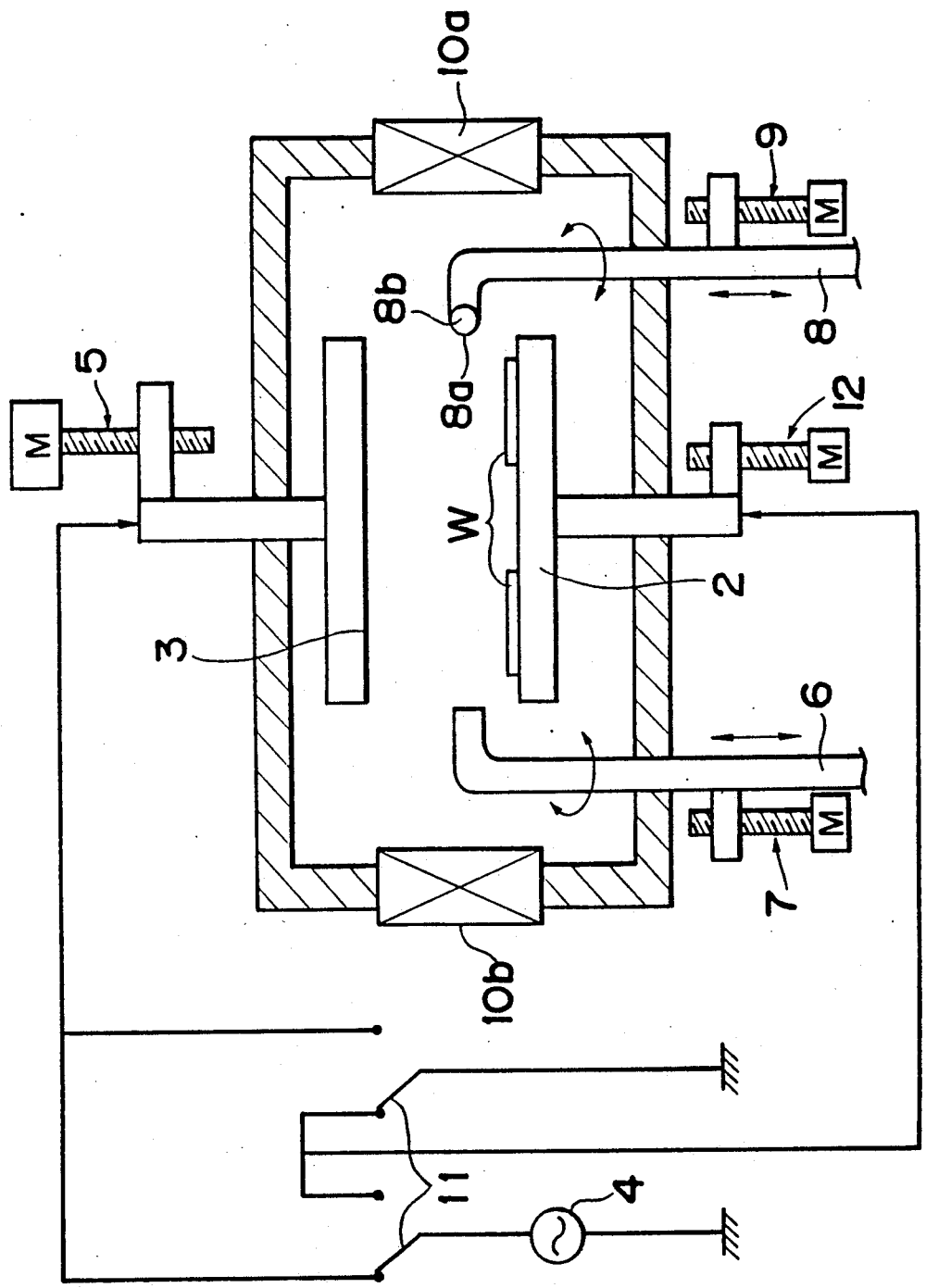
FIG. 3 is a schematic sectional view of a second embodiment of a plasma processing apparatus according to the invention.

Next, a second embodiment of the present invention will be explained with reference to FIG. 3. The second embodiment enables rapid cleaning inside the chamber 1 after a film is deposited by a chemical vapor deposition process. A switch 11 is located between a lower electrode 2 and an upper electrode 3 and a high frequency electric power source 4 and ground, so that one of the lower electrode 2 and the upper electrode 3 is selectively connected to the high frequency electric power source 4 while the other is connected to ground. Further, the lower electrode 3 is also controlled to be raised or lowered by a fourth lifting device 12 equipped with a motor. Except as mentioned above, the structure of the second embodiment is the same as that of the first embodiment.

By switching the direction of the high frequency electric voltage applied between the lower and upper electrodes 2 and 3 upon operating the switch 11, the ion assist effect can be effectively realized in the direction of both electrodes 2 and 3. Further, because both the lower and upper electrodes 2 and 3 can be moved, the positions of the electrodes 2 and 3 relative to the inner surface of the chamber 1 can be controlled to optimize cleaning while an optimum distance between the electrodes is maintained. The positions of the gas feed pipe 8 and the gas evacuation pipe 6 are then controlled. Thus, the cleaning of the electrodes 2 and 3 and the inside of the chamber 1 can be performed efficiently.

The lifting devices 5, 7, 9 and 11 comprise a screw driven by a motor. However, they can be other devices such as cylinder devices.

According to the present invention, at least one of a pair of electrodes can be moved, so that the distance between the electrodes can be set arbitrarily. Therefore, the electrode distance can be set to an optimum distance. Thus, in the cases of plural processing steps, the optimum distance can be set for each step. Further, the positions of the gas outlets of the gas pipe relative to the electrodes can be optimally set so that the gas flow and plasma discharge can be performed under optimum conditions. Therefore, the homogeneity of the plasma reaction can be increased, and the processing can be performed efficiently and with a high quality.

Further, by adjusting the position of the inlet of the evacuation pipe, the gas flow and plasma discharge can be performed under still more optimum conditions.

Still further, by changing the direction of the high frequency electric voltage upon cleaning, the ion assist effect can be exerted on both electrodes. By controlling the positions of both electrodes so that the positions of both electrodes can be adjusted to the chamber, the cleaning of the entire inside of the chamber can be performed efficiently.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A plasma processing apparatus, comprising:
    (a) a chamber;
    (b) means for evacuating said chamber, said evacuation means comprising a gas evacuation pipe having a gas inlet located within said chamber;
    (c) a pair of spaced apart electrodes confronting each other within said chamber;
    (d) first lifting means for selectively moving one of said pair of spaced apart electrodes in opposite first and second directions respectively extending toward and away from the other of said pair of spaced apart electrodes;
    (e) a high frequency electric power source means, connected to said pair of spaced apart electrodes, for supplying a high frequency electric voltage between said pair of spaced apart electrodes;
    (f) means for introducing gas into said chamber, said gas introduction means comprising a gas feed pipe having a gas outlet located within said chamber; and
    (g) second lifting means for selectively moving said gas outlet of said gas feed pipe of the gas introduction means in the opposite first and second directions.

2. A plasma processing apparatus according to claim 1, further comprising third lifting means for selectively moving said gas inlet of said gas evacuation pipe of said evacuation means in the opposite first and second directions.

3. A plasma processing apparatus according to claim 1, further comprising switch means, connected to said pair of spaced apart electrodes and said high frequency electric power source means, for changing a polarity of said high frequency electric voltage supplied to said pair of spaced apart electrodes.

4. A plasma processing apparatus according to claim 3, further comprising fourth lifting means for selectively moving said other of said pair of spaced apart electrodes in the first and second directions.

5. A plasma processing apparatus according to claim 1, further comprising fourth lifting means for selectively moving said other of said pair of spaced apart electrodes in the first and second directions.

* * * * *